US012593593B2

(12) United States Patent
Wang et al.

(10) Patent No.: US 12,593,593 B2
(45) Date of Patent: Mar. 31, 2026

(54) DISPLAY PANEL AND DISPLAY DEVICE

(71) Applicant: HKC CORPORATION LIMITED, Shenzhen (CN)

(72) Inventors: Hailiang Wang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 378 days.

(21) Appl. No.: 18/350,313

(22) Filed: Jul. 11, 2023

(65) Prior Publication Data

US 2024/0284747 A1 Aug. 22, 2024

(30) Foreign Application Priority Data

Feb. 17, 2023 (CN) .......................... 202310129023.1

(51) Int. Cl.
*H10K 59/38* (2023.01)
*H10K 59/80* (2023.01)

(52) U.S. Cl.
CPC ......... *H10K 59/38* (2023.02); *H10K 59/8791* (2023.02)

(58) Field of Classification Search
CPC .. H10K 59/38; H10K 59/8791; H10K 50/865; H10K 59/65; H10K 59/122; H10K 59/352; H10K 59/353; H10K 59/8792; H10K 59/12; H10K 59/126; H10K 59/40; H10K 59/60; G06V 40/1318; G06V 40/1324; G06V 40/13
See application file for complete search history.

(56) References Cited

FOREIGN PATENT DOCUMENTS

| | | |
|---|---|---|
| CN | 108549166 | 9/2018 |
| CN | 111063826 | 4/2020 |
| CN | 111063826 A | 4/2020 |
| CN | 111326562 | 6/2020 |
| CN | 115273661 | 11/2022 |
| CN | 115360314 A | 11/2022 |

(Continued)

OTHER PUBLICATIONS

Machine translation of CN 111063826 A (Year: 2020).*

(Continued)

*Primary Examiner* — Anne M Hines
*Assistant Examiner* — Jose M Diaz
(74) *Attorney, Agent, or Firm* — Hodgson Russ LLP

(57) ABSTRACT

A display panel comprises a pixel cell and anti-view sub-pixels, the anti-view sub-pixels are arranged at least between adjacent two of red, blue and green sub-pixels. The red and green sub-pixels each comprise a first/second light-emitting component, a quantum dot cell and a color resistor arranged in sequence, the blue sub-pixel comprises a light-emitting component and a transparent cell arranged in sequence, and the anti-view sub-pixel comprises an anti-view light-emitting component, an anti-view quantum dot cell and an anti-view layer arranged in sequence. The red and green quantum dot cells, the transparent cell and the anti-view quantum dot cells are located in the same layer and are arranged at intervals, and the color of the light emitted by the anti-view quantum dot cell under excitation is different from colors of the light emitted by two quantum dot cells adjacent to the anti-view quantum dot cell.

19 Claims, 8 Drawing Sheets

(56)        References Cited

FOREIGN PATENT DOCUMENTS

| CN | 115472658 |   | 12/2022 |   |   |
|----|-----------|---|---------|---|---|
| CN | 115528193 |   | 12/2022 |   |   |
| CN | 115528193 | A | 12/2022 |   |   |
| CN | 115915859 | A | 4/2023 |   |   |
| KR | 20170006039 | A | * 1/2017 | .......... | G09G 3/3406 |

OTHER PUBLICATIONS

Machine translation of CN 115528193 A (Year: 2022).*
CNIPA, First Office Action for CN Application No. 202310129023.
1, Apr. 8, 2023.
CNIPA, Second Office Action for CN Application No. 202310129023.
1, Apr. 27, 2023.
WIPO, International Search Report for International Application
No. PCT/CN2023/102425, Oct. 26, 2023.

* cited by examiner

16
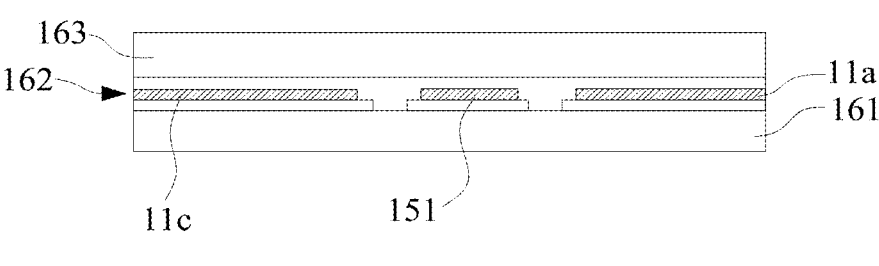
FIG. 5
17
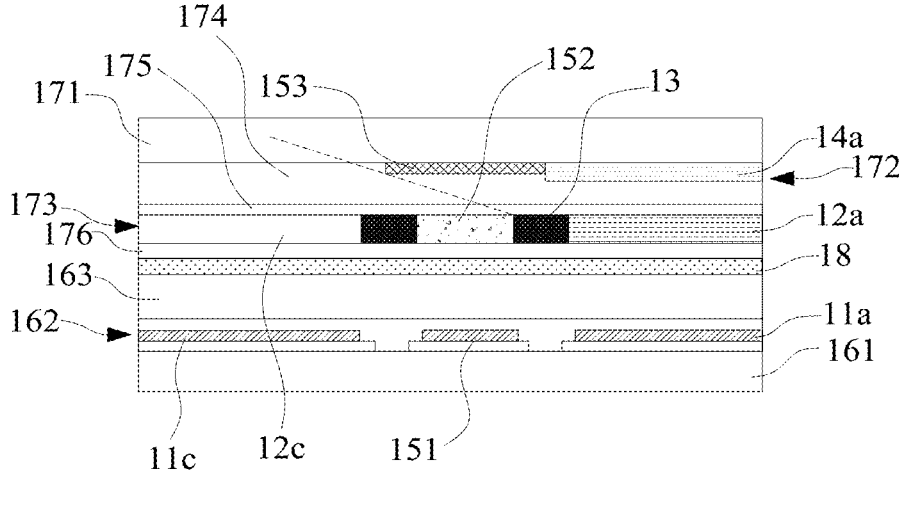
FIG. 6
FIG. 7

DISPLAY PANEL AND DISPLAY DEVICE

CROSS-REFERENCE TO RELATED APPLICATIONS

This application claims priority to Chinese Patent Application No. 202310129023.1, filed Feb. 17, 2023, the entire disclosures of which are incorporated herein by reference.

TECHNICAL FIELD

The present application relates to the field of display technology, more particularly, to a display panel and a display device.

BACKGROUND

In modern society, it is very common to use computers and mobile phones in public places. With the development of network technology, more and more people shop or trade accounts on the Internet. In the process of the above operations, operators often need to input personal information on computers, mobile phones, automatic teller machines, automatic ticket picking machines and other display devices, which easily leads to personal information leakage. Therefore, the anti-view performance of display devices has been paid more and more attention.

Quantum dot display panel has a wider viewing angle, which can bring better visual experience to users. However, it is inconvenient to switch between normal display and anti-view display.

SUMMARY

There are provided a display panel and a display device according to embodiments of this application. The technical solution is as below:

According to a first aspect of the present application, there is provided a display panel, which comprises a plurality of pixel cells arranged in an array, each of the pixel cells comprising a plurality of display sub-pixels emitting different colors of light. Each of the display sub-pixels comprising a red sub-pixel, a blue sub-pixel and a green sub-pixel. The display panel further comprises an anti-view sub-pixel, and the anti-view sub-pixel is located between at least two adjacent display sub-pixels. The red sub-pixel comprises a first blue light-emitting component, a red quantum dot cell and a red color resistor arranged in sequence, the green sub-pixel comprises a second blue light-emitting component, a green quantum dot cell and a green color resistor arranged in sequence. The blue sub-pixel comprises a third blue light-emitting component and a transparent cell arranged in sequence. The anti-view sub-pixel comprises an anti-view blue light-emitting component, an anti-view quantum dot cell and an anti-view layer arranged in sequence. The anti-view blue light-emitting component and the anti-view quantum dot cell are located in an orthographic projection of the anti-view layer, and a color of the anti-view quantum dot cell is different from a color of the quantum dot cell adjacent to the anti-view quantum dot cell.

According to a second aspect of the present application, there is provided a display device, which includes a main board and the display panel of any one of the above, the main board is electrically connected to the display panel.

It should be understood that the above general description and the following detailed description are exemplary and explanatory only and are not intended to limit the present application.

BRIEF DESCRIPTION OF DRAWINGS

The accompanying drawings, which are incorporated in and constitute a part of the description, illustrate embodiments consistent with the present application and, together with the description, serve to explain the principles of the present application. It will be apparent that the drawings described below are only some embodiments of the present application, and other drawings may be obtained from them without creative effort for those of ordinary skill in the art.

FIG. 5 shows a schematic structural diagram of the first base board provided in embodiment 1 or embodiment 7 of the present application.

FIG. 6 shows a schematic structural diagram of the second base board provided in embodiment 1 or embodiment 7 of the present application.

FIG. 7 is a schematic structural diagram of contact between the anti-view layer and a red color resistor provided in embodiment 1 or embodiment 7 of the present application.

DETAILED DESCRIPTION

The exemplary embodiments will now be described more fully with reference to the accompanying drawings. However, the example embodiments can be implemented in a variety of forms and should not be construed as being limited to the examples set forth herein. Rather, these embodiments are provided so that the present application will be more comprehensive and complete, and the concept of exemplary embodiments will be fully communicated to those skilled in the art.

In the present application, the terms "first", "second" are for descriptive purposes only and cannot be construed as indicating or implying relative importance or implying the number of the indicated technical features. Thus, features defined with "first" and "second" may explicitly or implicitly include one or more of the features. In the description of the present application, "multiple" means two or more unless otherwise expressly specified.

In the present application, the terms "install", "connect" and the like are to be understood in a broad sense, unless otherwise expressly specified and limited, for example, it can be a fixed connection, may also be a detachable connection, or be integral; which may refer to a mechanical connection or an electrical connection; which may refer to a direct connection or an indirect connection via an intermediate medium; which may also refer to a communication between the insides of two elements. For those ordinarily skilled in the art, the specific meanings of the above terms in the present application will be understood according to the specific circumstances.

Further, the described features, structures or characteristics may be incorporated in any suitable manner in one or more embodiments. In the following description many specific details are provided to give a full understanding of the embodiments of the present application. However, those skilled in the art will appreciate that the technical aspects of the present application may be practiced without one or more of the specific details, or other methods, components, devices, steps and the like may be employed. In other instances, the common methods, devices, implementations or operations are not shown or described in detail to avoid obscuring aspects of the present application.

Embodiment 1

Figure 1:
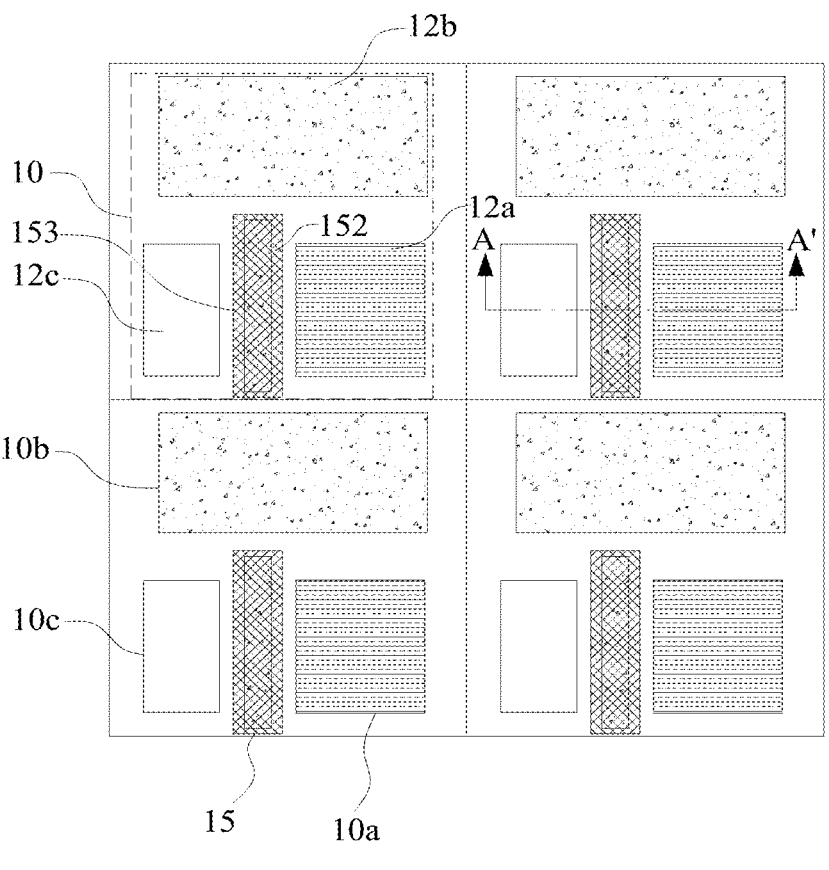
FIG. 1 shows a schematic structural diagram of arrangement of part of a partial pixel cell arrays provided in embodiment 1 or embodiment 7 of the present application.
Figure 2:
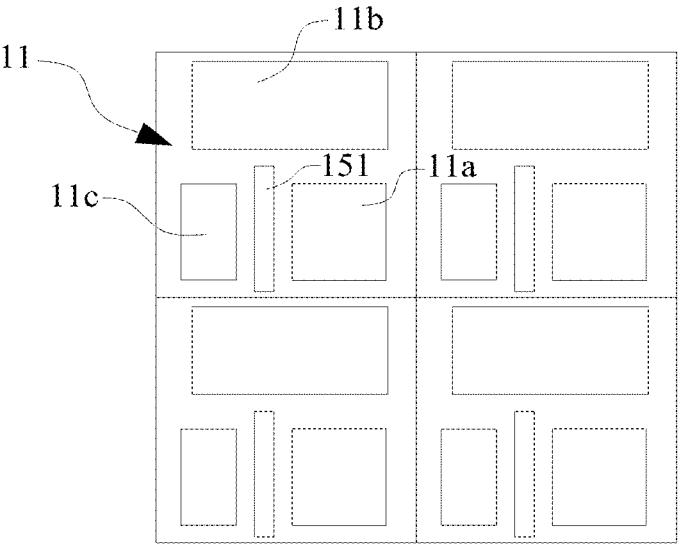
FIG. 2 shows a schematic structural diagram of a light-emitting component and an anti-view light-emitting component provided in embodiment 1 or embodiment 7 of the present application.
Figure 3:
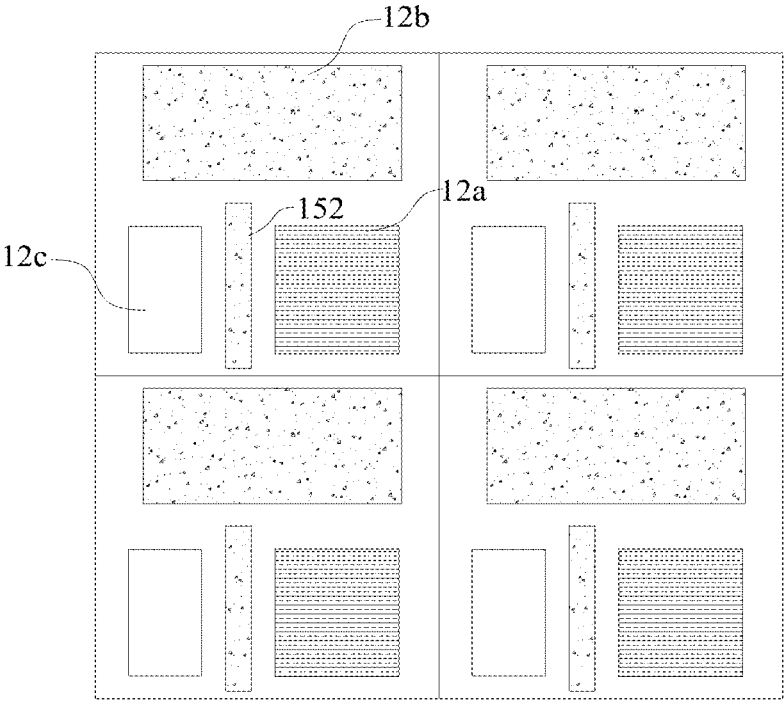
FIG. 3 shows a schematic structural diagram of a quantum dot cell and an anti-view quantum dot cell provided in embodiment 1 or embodiment 7 of the present application.

Embodiment 1 provides a display panel 1, which, as shown in FIGS. 1, 2 and 3, includes a plurality of pixel cells 10 arranged in an array, and each of the pixel cells 10 includes three sub-pixels arranged at intervals, namely, a red sub-pixel 10a, a green sub-pixel 10b and a blue sub-pixel 10c.

The red sub-pixel 10a, the green sub-pixel 10b, and the blue sub-pixel 10c each include light-emitting components 11 that emit blue light, which are respectively a first blue light-emitting component 11a, a second blue light-emitting component 11b, and a third blue light-emitting component 11c. In order to allow the red sub-pixel 10a to achieve the red display, the green sub-pixel 10b to achieve the green display and the blue sub-pixel 10c to achieve the blue display, the red sub-pixel 10a also includes a red quantum dot cell 12a, the green sub-pixel 10b includes a green quantum dot cell 12b and the blue sub-pixel 10c includes a transparent cell 12c. The red quantum dot cell 12a, the green quantum dot cell 12b and the transparent cell 12c are separated by light shielding posts 13 to avoid cross-color and ensure the display effect.

It should be noted that the first blue light-emitting component 11a corresponds to the red quantum dot cell 12a, and it can be understood that the orthographic projection of the first blue light-emitting component 11a can be located in the red quantum dot cell 12a. The orthographic projection of the first blue light-emitting component 11a may partially overlap the red quantum dot cell 12a. It may also be that the orthographic projection of the first blue light-emitting component 11a completely overlaps the red quantum dot cell 12a, so as to ensure that the red quantum dot cell 12a can be excited to emit red light.

Accordingly, the second blue light-emitting component 11b and the green quantum dot cell 12b as well as the third blue light-emitting component 11c and the transparent cell 12c may also be arranged in the same manner as described above.

It can be understood that when the blue light emitted by the first blue light-emitting component 11a passes into the red quantum dots, the red quantum dot cell 12a is excited to emit red light. When the blue light emitted by the second blue light-emitting component 11b passes into the green quantum dots, the green quantum dot cell 12b is excited to emit green light. The blue light emitted by the third blue light-emitting component 11c passes through the transparent cell 12c and what is emitted out is the blue light. Color display of the display panel 1 is achieved by exciting the red quantum dot cell 12a to emit red light, exciting the green quantum dot cell 12b to emit green light, and blue light emitted through the transparent cell 12c.

It should be noted that since the blue sub-pixel 10c includes the light-emitting component 11 that emits blue light, the blue sub-pixel 10c does not need to be provided with the blue quantum dot cell, thereby reducing the production cost.

Further, the transparent cell 12c may be made of an organic insulating dielectric material (OC), i.e., the light-emitting component 11 can emit blue light through the transparent cell 12c.

Figure 4:
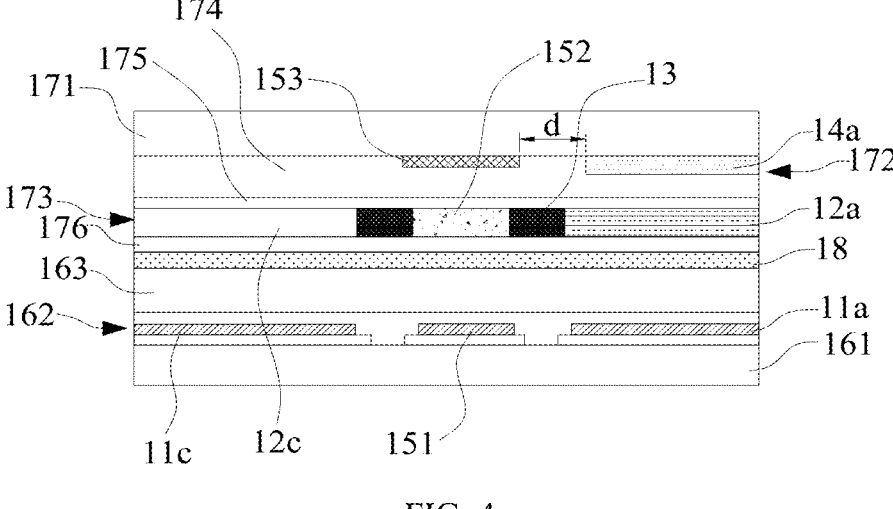
FIG. 4 shows a cross-sectional schematic diagram taken in a line A-A' in FIG. 1.

In addition, as shown in FIG. 4, the red sub-pixel 10a includes a red color resistor 14a for improving the purity of red light emitted from the red quantum dot cell 12a. The green sub-pixel 10b also includes a green color resistor for improving the purity of green light emitted from the green quantum dot cell 12b. By providing the red color resistor 14a and the green color resistor, the purity of light emitted can be effectively improved, so that the red light and the green light are brighter, and the display effect of the display panel 1 can be improved.

Referring to FIGS. 1 and 4, in order to achieve the anti-view function, the display panel 1 further includes an anti-view sub-pixel 15 including an anti-view light-emitting component 151, an anti-view quantum dot cell 152 and an anti-view layer 153. The anti-view layer 153 corresponds to the anti-view quantum dot cell 152 and the anti-view light-emitting component 151.

In the present embodiment, the display panel 1 includes a plurality of anti-view sub-pixels 15, each of anti-view sub-pixels 15 is correspondingly provided in each pixel cell 10, the anti-view sub-pixel 15 is located between two adjacent sub-pixels. The two adjacent sub-pixels may be a red sub-pixel 10a and a green sub-pixel 10b, or a green sub-pixel 10b and a blue sub-pixel 10c, or a red sub-pixel 10a and a blue sub-pixel 10c. When the anti-view sub-pixel 15 is located between two sub-pixels, the anti-view sub-pixel 15 presents a color different from the two sub-pixels, which is the same color as one of the non-adjacent sub-pixels in the pixel cell 10.

For example, when the anti-view sub-pixel 15 is located between the blue sub-pixel 10*c* and the red sub-pixel 10*a*, the anti-view sub-pixel 15 appears the same color as the green sub-pixel 10*b*, that is, the anti-view sub-pixel 15 appears green. That is to say, the anti-view quantum dot cell 152 in the anti-view sub-pixel 15 is excited by the blue light emitted by the anti-view light-emitting component 151, which is different from the light emitted by the adjacent transparent cell 12*c* and the red quantum dot cell 12*a*, so that the light emitted by the adjacent blue sub-pixel 10*c* and the red sub-pixel 10*a* is mixed in color, which affects the reading of information in the side-view perspective. Since the light emitting side of the anti-view quantum dot cell 152 has an anti-view layer 153, the anti-view layer 153 shields the light emitted by the anti-view quantum dot cell 152 in the front perspective, ensuring normal display in the front perspective, thereby achieving the anti-view function.

Referring to FIG. 1, in one pixel cell 10, the blue sub-pixels 10*c* and the red sub-pixels 10*a* may be arranged at intervals on the same row, and the anti-view sub-pixels 15 are also arranged at intervals in the same row direction with the blue sub-pixels 10*c* and red sub-pixels 10*a*, and the green sub-pixels 10*b* correspond to the red sub-pixels 10*a*, the blue sub-pixels 10*c* and the anti-view sub-pixels 15 in the column direction. The embodiments of the present application just adopt such a structure, which can increase the aperture ratio of a pixel cell 10, and can also adjust the area size occupied by corresponding sub-pixels according to different required colors. For example, the required green color is the largest and the blue color is the smallest, the green sub-pixel 10*b* has the largest area, the blue sub-pixel 10*c* has the smallest area, and the red sub-pixel 10*a* has an area between them.

It is worth mentioning that when the anti-view sub-pixel 15 is located between adjacent sub-pixels, the length of the anti-view sub-pixel 15 in the column direction is larger than the length of the adjacent two sub-pixels in the column direction, so that the light emitted by the adjacent two sub-pixels can be better mixed to ensure the anti-view effect.

Further, as shown in FIG. 4, the anti-view layer 153 may be a black matrix (BM), i.e., made of a black opaque material, to ensure that a normal display screen is viewed from a front perspective. In the side-view perspective, the anti-view light-emitting component 151 emits blue light, excites the anti-view quantum dot cell 152 to emit light different from the adjacent sub-pixels, mixes the light emitted by the adjacent sub-pixels, interferes with the reading of information, and further causes the side-view perspective information to be read incorrectly, resulting in the wide angle of view not being visible. Since the anti-view layer 153 corresponds to the anti-view quantum dot cell 152, the anti-view layer 153 shields the light emitted by the anti-view quantum dot cell 152 in the front perspective, so that the front perspective is normal, and the narrow viewing angle is visible, but the wide viewing angle is invisible, thereby achieving the anti-view function. When the anti-view light-emitting component 151 is turned off, the anti-view quantum dot cell 152 does not mix the light emitted by adjacent sub-pixels, does not interfere with the reading of information, and makes the side-view perspective (wide viewing angle) display normal, thereby achieving wide viewing angle display.

That is to say, by turning on or off the anti-view light-emitting component 151, one-key switching of wide viewing angle or narrow viewing angle display can be achieved, and the switching of wide viewing angle and narrow viewing angle is simpler and the operation is more convenient.

It is worth mentioning that the pixel cell 10 may also include three or more sub-pixels of different colors, for example, a red sub-pixel 10*a*, a green sub-pixel 10*b*, a blue sub-pixel 10*c* and a yellow sub-pixel. The anti-view sub-pixel 15 is arranged between the adjacent two of the red sub-pixel 10*a*, the green sub-pixel 10*b*, the blue sub-pixel 10*c* and the yellow sub-pixel, and emits light of different colors from the adjacent sub-pixels. By turning on or off the anti-view light-emitting component 151, one-key switching between normal display and anti-view display can be achieved.

Further, in order to more conveniently manufacture the anti-view layer 153 and the quantum dot cell, the display panel 1 includes a first base board 16 and a second base board 17 arranged by cell assembling.

As shown in FIG. 5, the first base board 16 includes a first substrate 161 and a blue light emitting layer 162 formed on the first substrate 161, the blue light emitting layer 162 including a plurality of light-emitting components 11 arranged at intervals, and three light-emitting components 11 arranged at intervals constitute the first blue light-emitting component 11*a*, the second blue light-emitting component 11*b* and the third blue light-emitting component 11*c* of the pixel cell 10 described above. In addition, the anti-view light-emitting component 151 is located between the two light-emitting components 11, so as to facilitate color mixing of light emitted by adjacent sub-pixels and achieve the anti-view function.

It should be noted that the first substrate 161 may be a rigid substrate made of glass, but is not limited thereto, and may also be a flexible substrate made of a material such as polyimide (abbreviated as polyimide). That is, the display panel 1 of the present application is not limited to a rigid non-bendable panel, but may also be a flexible bendable panel.

It should be understood that in order to achieve the display of the light-emitting component 11 and the anti-view light-emitting component 151, at the light-emitting component 11, an anode, the light-emitting component 11 and a cathode are sequentially stacked on the first substrate 161; and at the anti-view light-emitting component 151, the anode, the anti-view light-emitting component 151 and the cathode are stacked on the first substrate 161 in sequence.

The anodes corresponding to the light-emitting component 11 and the anti-view light-emitting component 151 are arranged at intervals, so that the light-emitting component 11 and the anti-view light-emitting component 151 can be driven independently of each other, thereby achieving switching between normal display and anti-view display, so that the embodiments of the present application can achieve one-key switch to anti-view, and the switching between anti-view and normal display is convenient and simple. In addition, the cathode of the light-emitting components 11 in each pixel cell 10 may be connected to each other to achieve simultaneous on and simultaneous off state, and the control is simpler. The cathode of the anti-view light-emitting component 151 can also be connected to each other to achieve simultaneous on or simultaneous off state. Of course, the cathode of the anti-view light-emitting component 151 can also be disconnected from each other to be controlled one by one for more precise control.

It should be noted that the anode may be indium tin oxide (ITO), indium zinc oxide (IZO), zinc oxide (ZnO) or indium oxide ($In_2O_3$).

Next, the light-emitting component 11 and the anti-view light-emitting component 151 may include at least two layers of stacked light-emitting parts, for example, the light-emitting component 11 or the anti-view light-emitting component 151 is formed by stacking two layers of blue light-emitting parts in the thickness direction of the first substrate 161; or the light-emitting component 11 or the anti-view light-emitting component 151 is formed by stacking three layers of blue light emitting parts in the thickness direction of the first substrate 161.

It should be noted that the thicknesses of the light-emitting component 11 and the anti-view light-emitting component 151 are 0 to 10 μm, for example, 1 μm, 2 μm, 3 μm, 4 μm, 4.5 μm, 5, 5.5, 6 μm, 6.5 μm, 7 μm, 7.5 μm, 8 μm, 8.5 μm, 9 μm, 9.5 μm and 10 μm.

In addition, the cathode of the light-emitting component 11 and the cathode of the anti-view light-emitting component 151 may be connected to each other to form electrodes of an entire surface to reduce the manufacturing cost. The cathode may include a low work function material layer comprising Li, Ca, LiF/Ca, LiF/Al, Al, Mg, Ag, Pt, Pd, Ni, Au, Nd, Ir, Cr, BaF$_2$, Ba, compounds thereof, or mixtures thereof. For example, the cathode may include a low work function material layer made from a mixture of Ag and Mg.

Further, as shown in FIG. 5, the first base board 16 further includes a sealed encapsulation layer 163, the sealed encapsulation layer 163 is arranged on the cathode away from the first substrate 161, and can block water and oxygen outside, to avoid affecting the working states of the light-emitting component 11 and the anti-view light-emitting component 151.

Secondly, as shown in FIG. 6, the second base board 17 includes a second substrate 171, an anti-view layer 153, a color resistor layer 172 and a quantum dot layer 173. The second substrate 171 and the first substrate 161 correspond to each other. The anti-view layer 153 and the color resistor layer 172 are located in the same layer and are made of different masks. The quantum dot layer 173 is arranged on the side of the anti-view layer 153 away from the second substrate 171.

The second substrate 171 may be a rigid substrate made of glass, but is not limited thereto, and may also be a flexible substrate made of a material such as polyimide (abbreviated as polyimide). That is, the display panel 1 of the present application is not limited to a rigid non-bendable panel, but may also be a flexible bendable panel.

The thickness of the second substrate 171 is 0.1 millimeters (mm) to 0.2 millimeters (mm), and may be, for example, 0.1 mm, 0.12 mm, 0.14 mm, 0.16 mm, 0.18 mm, 0.2 mm.

Secondly, the anti-view layer 153 is arranged on a side of the second substrate 171 close to the first substrate 161, and the anti-view layer 153 corresponds to the anti-view light-emitting component 151, and an orthographic projection of the anti-view light-emitting component 151 on the first substrate 161 is located within an orthographic projection of the anti-view layer 153 on the first substrate 161, so as to completely block the anti-view light-emitting component 151 in the front perspective, and avoid affecting the viewing effect in the front perspective.

The anti-view layer 153 may be made of a metallic material such as Molybdenum (Mo) or Titanium (Titanium, T). Alternatively, the anti-view layer 153 is made of a nonmetallic material such as a black matrix material (BM) or an organic photoresist plus carbon black.

When the anti-view layer 153 is made of a metallic material, the thickness of the anti-view layer 153 may be 0.1 microns (μm) to 0.6 microns (μm), for example, may be 0.1

μm, 0.2 μm, 0.3 μm, 0.4 μm, 0.5 μm, 0.6 μm. When the anti-view layer 153 is made of a non-metallic material, the thickness of the anti-view layer 153 may be 0.5 microns (μm) to 3 microns (μm), for example, may be 0.5 μm, 0.6 μm, 0.7 μm, 0.8 μm, 0.9 μm, 1 μm, 1.5 μm, 1.8 μm, 2 μm, 2.5 μm, 2.8 μm and 3 μm.

It can be understood that when the anti-view layer 153 is made of a metallic material and a nonmetallic material, the thickness of the corresponding anti-view layer 153 is different to ensure that light cannot pass through the anti-view layer 153 in the front perspective, thereby ensuring that the front perspective is normal.

In addition, the color resistor layer 172 located in the same layer as the anti-view layer 153 includes at least two color resistors of different colors, and adjacent color resistors are arranged at intervals. The anti-view layer 153 and the color resistor adjacent to it have a distance d, and the distance d satisfies 0≤d≤16 μm. In some embodiments, the anti-view layer 153 does not contact with the color resistor layer 172 in the same layer, namely, 0<d≤16 μm.

It should be noted that when the pixel cells are three sub-pixels of different colors, the color resistor layer 172 corresponding to the blue sub-pixel 10c has no color resistor, since the light emitted by the light-emitting component 11 corresponding to the blue sub-pixel 10c is blue light, there is no need to provide a corresponding blue color resistor to improve the purity of the blue light, thus saving the manufacturing process and reducing the production cost.

As shown in FIG. 7, when a distance between the anti-view layer 153 and the color resistor adjacent to it is 0, and the anti-view sub-pixel 15 is located between the blue sub-pixel 10c and the red sub-pixel 10a, the anti-view layer 153 contacts with the red color resistor 14a to absorb all the light scattered from the anti-view quantum dot cell 152 to the red color resistor 14a, and does not mix with the light emitted from the red quantum dot cell 12a, that is, does not interfere with the information reading of the side-view perspective, and the display from the view angle on the corresponding side is normal at this time. However, there is no blue color resistor at the blue sub-pixel 10c, and the light emitted by the anti-view quantum dot cell 152 is mixed with the blue light passing through the transparent cell, which interferes with the information reading of the side-view perspective here, and the display from side the view angle on the corresponding side is abnormal.

That is, when the anti-view sub-pixel 15 is between the red sub-pixel 10a (or the green sub-pixel 10b) and the blue sub-pixel 10c, and the distance between the anti-view layer 153 and the adjacent color resistor is 0, the anti-view sub-pixel 15 being turned on enables one side to be anti-view while the other side is displayed normally.

Next, when the distance between the anti-view layer 153 and the adjacent color resistor is 16 μm, the color resistor completely coincides with the orthographic projection of the light-emitting component 11 on the first substrate 161, and the anti-view layer 153 completely coincides with the orthographic projection of the anti-view light-emitting component 151 on the first substrate 161. When the anti-view quantum dot cell 152 is excited by the anti-view light-emitting component 151 to emit light, the light is emitted through the distance d between the anti-view layer 153 and the adjacent color resistors, so as to affect the emission of sub-pixels on both sides of the anti-view sub-pixel 15 and interfere with the reading of the side-view perspective, thereby achieving bilateral anti-view.

It should be noted that when the distance between the anti-view layer 153 and the adjacent color resistor becomes smaller, the orthographic projection of the quantum dot cell corresponding to the color resistor on the first substrate 161 is within the orthographic projection of the color resistor on the first substrate 161. In this way, the light emitted by the quantum dot cell is more absorbed by the color resistor and thus releases more brightness, thereby making the display panel 1 brighter.

Conversely, the larger the distance d between the anti-view layer 153 and the adjacent color resistor, the smaller the area covered by the color resistor, and the less light it receives, so that the brightness is lower.

That is, the corresponding brightness and the one-side or two-side anti-view function of the anti-view layer 153 can be adjusted according to the distance d between the anti-view layer 153 and the adjacent color resistor.

For example, as shown in FIG. 7, when the anti-view sub-pixel 15 is located between the red sub-pixel 10a and the blue sub-pixel 10c, since the side adjacent to the anti-view sub-pixel 15 is the blue sub-pixel 10c, there is no blue color resistor on this side. When the distance d between the anti-view layer 153 and the red color resistor 14a is equal to 0, the anti-view layer 153 and the red color resistor 14a come into contact, and the anti-view quantum dot cell 152 is excited to emit green light to the red sub-pixel 10a side, and the green light is shielded by the anti-view layer 153 and the red color resistor 14a, so as not to mix with the red light in the red sub-pixel 10a, thus ensuring normal information reading on this side. Since there is no blue color resistor at the blue sub-pixel 10c, the green light is mixed with the blue light emitted by the blue sub-pixel 10c, which interferes with the information reading on this side, thereby achieving one-side anti-view.

Figure 8:
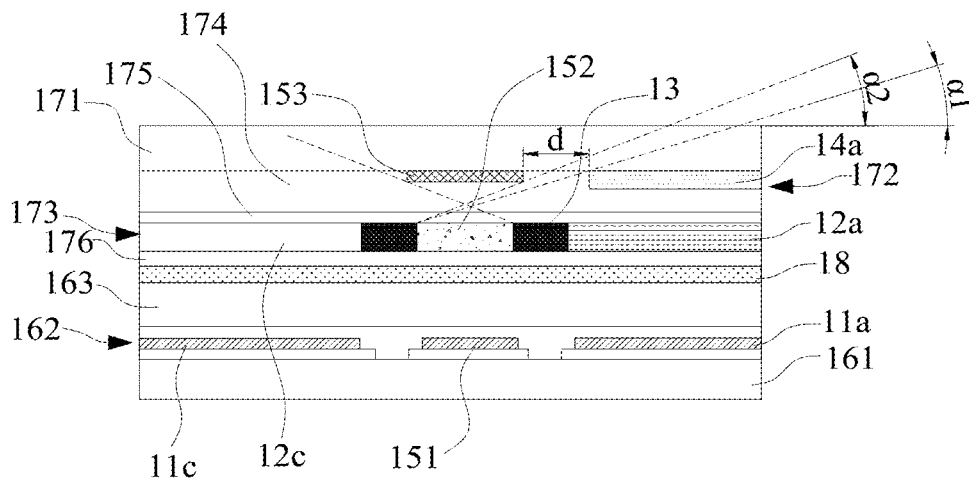
FIG. 8 shows a schematic structural diagram of a distance d between the anti-view layer and the red color resistor provided in embodiment 1 or embodiment 7 of the present application.

Referring to FIG. 8, when there is a distance between the anti-view layer 153 and the red color resistor 14a, the green light emitted from the anti-view quantum dot cell 152 is emitted at the distance d, that is, the green light interferes with the red light out from the red color resistor 14a at an angle of α1 minus α2, affecting information reading at this angle, that is, the anti-view function is achieved only at this angle. When the distance d is smaller, the angle at which the green light is emitted out is small, the angle of interference view is small, and the angle of anti-view is small. When the distance d is larger, the angle at which the green light is emitted out is large, the angle of interference view is large, and the angle of anti-view is large.

In addition, since the blue sub-pixel 10c has no blue color resistor, that is, the blue sub-pixel 10c determines its anti-view angle according to the design size of the anti-view layer 153, the wider the anti-view layer 153, the larger the anti-view angle, and the narrower the anti-view layer 153, the smaller the anti-view angle.

Further, the quantum dot layer 173 is arranged on the side of the anti-view layer 153 away from the second substrate 171. The quantum dot layer 173 includes quantum dot cells and anti-view quantum dot cells 152 arranged at intervals with each other. The quantum dot cells correspond to the light-emitting component 11, and the anti-view quantum dot cells 152 correspond to the anti-view light-emitting component 151. The anti-view quantum dot cells 152 have different colors from the adjacent two quantum dot cells, so that when the quantum dot cells emit light and the anti-view quantum dot cells emit light, the anti-view quantum dot cells 152 can mix colors of the light emitted by the adjacent two quantum dot cells and interfere with the information reading from the side-view perspective, thereby achieving anti-view An example of a pixel cell 10 including a red sub-pixel 10a, a green sub-pixel 10b and a blue sub-pixel 10c and one anti-view sub-pixel 15 will be explained.

In one pixel cell 10, the quantum dot layer 173 includes a red quantum dot cell 12a, a green quantum dot cell 12b, a transparent cell 12c and an anti-view quantum dot cell 152. The red quantum dot cell 12a corresponds to the first blue light-emitting component 11a on the first base board 16 so that blue light excites the quantum dots in the red quantum dot cell 12a to emit red light, the green quantum dot cell 12b corresponds to the second blue light-emitting component 11b on the first base board 16 so that blue light excites the quantum dots in the green quantum dot cell 12b to emit green light, the transparent cell 12c corresponds to a third blue light-emitting component 11c so that the light emitted by the third blue light-emitting component 11c directly pass through the transparent cell 12c to display blue, thereby achieving color display of the display panel 1. The anti-view quantum dot cell 152 corresponds to the anti-view light-emitting component 151 on the first base board 16 to emit light under the excitation of the anti-view light-emitting component 151.

The color of the anti-view quantum dot cell 152 is different from that of two adjacent quantum dots, so as to mix the colors of light emitted by adjacent sub-pixels, thereby achieving the anti-view function.

For example, when the anti-view quantum dot cell 152 is located between the red quantum dot cell 12a and the transparent cell 12c, the quantum dots in the anti-view quantum dot cell 152 may be the same as those in the green quantum dot cell 12b, that is, the blue light emitted by the anti-view light-emitting component 151 excites the anti-view quantum dot cell 152 to emit green light.

When the anti-view quantum dot cell 152 is located between the red quantum dot cell 12a and the green quantum dot cell 12b, the quantum dots in the anti-view quantum dot cell 152 may be the same as in the transparent cell 12c, that is, the blue light emitted by the anti-view light-emitting component 151 emits blue light through the transparent cell 12c.

When the anti-view quantum dot cell 152 is located between the green quantum dot cell 12b and the transparent cell 12c, the quantum dots in the anti-view quantum dot cell 152 may emit red light the same as those in the red quantum dot cell 12a, that is, the blue light emitted by the anti-view light-emitting component 151 excites the anti-view quantum dot cell 152 to emit red light.

Further, as shown in FIGS. 4 and 6, light-shielding posts 13 are disposed between either two of the anti-view quantum dot cell 152, the red quantum dot cell 12a, the green quantum dot cell 12b, and the transparent cell 12c. The light-shielding posts 13 may be made of a black light-shielding material, such as Molybdenum (Mo) or Titanium (Titanium, Ti) and the like, so as to provide accommodation space for quantum dots and avoid cross-color between quantum dots.

Further, the orthographic projection of the anti-view layer 153 corresponding to the anti-view quantum dot cell 152 on the first substrate 161 partially overlaps the orthographic projection of the light shielding posts 13 on both sides of the anti-view quantum dot cell 152 on the first substrate 161, so as to better shield the anti-view quantum dot cell 152 when the anti-view quantum dot cell 152 emits light and avoid affecting the front perspective.

In the embodiments of the present application, the orthographic projection of the anti-view quantum dot cell 152 overlaps the orthographic projection of the anti-view light-emitting component 151 on the first substrate 161, and the orthographic projection of the anti-view light-emitting component 151 does not overlap the orthographic projection of the light shielding post 13 on the first substrate 161, so as to ensure that a large part of the light energy emitted by the anti-view light-emitting component 151 enters the anti-view quantum dot cell 152, ensure that the anti-view quantum dot cell 152 can be fully excited to emit light of corresponding colors, and ensure the anti-view effect.

Accordingly, orthographic projections of the first blue light-emitting component 11*a*, the second blue light-emitting component 11*b* and the third blue light-emitting component 11*c* on the first substrate 161 do not overlap, to ensure a display effect.

Further, as shown in FIG. 6, the second base board 17 further includes a flat layer 174 and a first encapsulation layer 175 and a second encapsulation layer 176 arranged on the upper and lower sides of the quantum dot layer 173.

The planarization layer 174 is arranged on the second substrate 171 and completely covers the anti-view layer 153 on the second substrate 171, so as to achieve the planarization effect and ensure that the surface is flat and closely attached. The flat layer 174 may be made of an organic insulating dielectric material (OC).

The first encapsulation layer 175 is located on a side of the flat layer 174 away from the second substrate 171, and the second encapsulation layer 176 is located on a side of the quantum dot layer 173 away from the second substrate 171. The quantum dots are sealed by the first encapsulation layer 175 and the second encapsulation layer 176 to avoid leakage of the quantum dots and affect the display effect.

The first encapsulation layer 175 and the second encapsulation layer 176 may be an inorganic encapsulation layer, which is better than an organic encapsulation layer in insulating water and oxygen.

It is worth mentioning that the anti-view layer 153 and quantum dot layer 173 are provided on the second base board 17, so that the anti-view layer 153 and the quantum dot layer 173 and the display organic light-emitting component and the anti-view light-emitting component 151 are manufactured independently of each other, so that the anti-view layer 153 and the quantum dot layer 173 and the like can be manufactured on the second base board 17 using a conventional non-OLED low-temperature process, thus better protecting the display organic light-emitting component and the anti-view light-emitting component 151, improving the yield and reducing the production cost.

In addition, the first base board 16 and the second base board 17 may be connected by adhesion or electrostatic adsorption.

For example, as shown in FIG. 4, when the first base board 16 and the second base board 17 are connected by bonding, the display panel 1 further includes a bonding layer 18, one side of the bonding layer 18 is bonded to the side of the sealing encapsulation layer 163 away from the first substrate 161 of the first base board 16, and the other side of the bonding layer 18 is bonded to a side of the second encapsulation layer 176 away from the second substrate 171 of the second base board 17.

Figure 9:
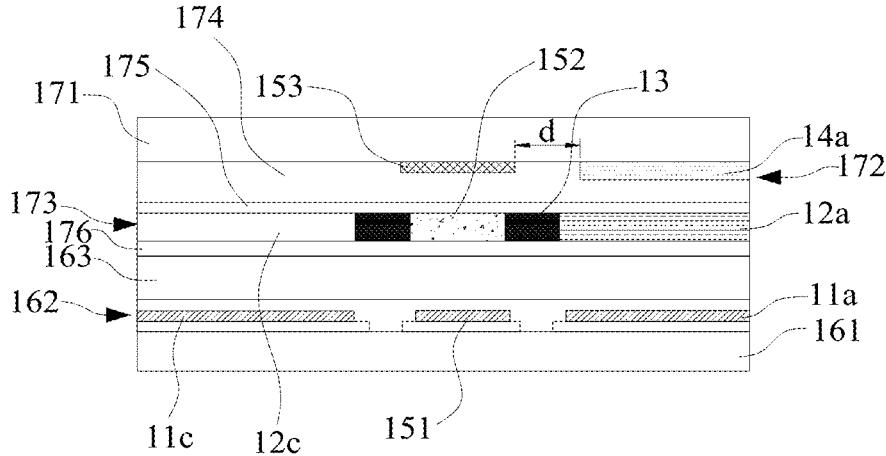
FIG. 9 shows a schematic structural diagram of electrostatic adsorption between a first base board and a second base board provided in embodiment 1 or embodiment 7 of the present application.

As shown in FIG. 9, when the first base board 16 and the second base board 17 are connected by bonding or electrostatic adsorption, the display panel 1 can be bent for display since the polarizing layer is not provided on the side of the second base board 17 away from the first base board 16.

Figure 10:
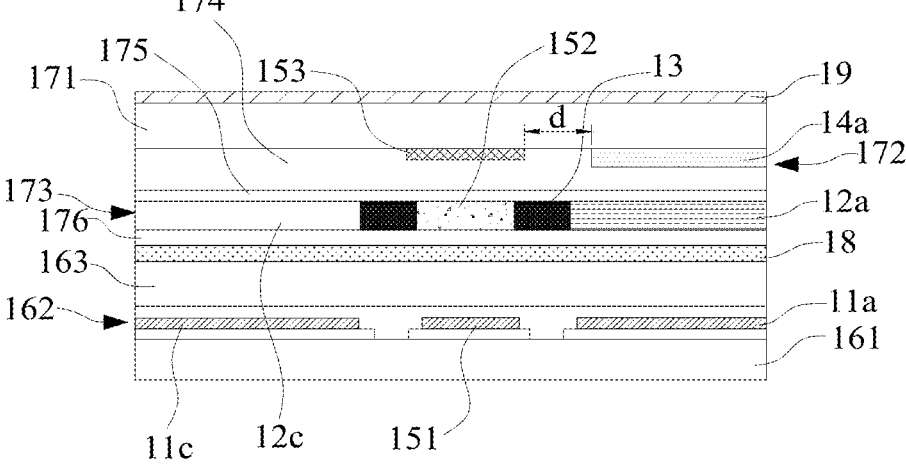
FIG. 10 shows a schematic structural diagram of an anti-reflection layer provided on a side of the second base board away from the first base board provided in embodiment 1 or embodiment 7 of the present application.

Further, as shown in FIG. 10, the display panel 1 further includes an anti-reflection layer 19. The anti-reflection layer 19 is arranged on the side of the second base board 17 away from the first base board 16. The anti-reflection layer 19 can reduce the reflection intensity of ambient light on the screen, thereby eliminating the polarizer of the display panel 1, which not only reduces the overall thickness of the display panel 1, but also may improve the light output rate. The brightness of the emitted light is greatly increased, so that the power consumption of the display panel 1 is also reduced.

Embodiment 2

Figure 11:
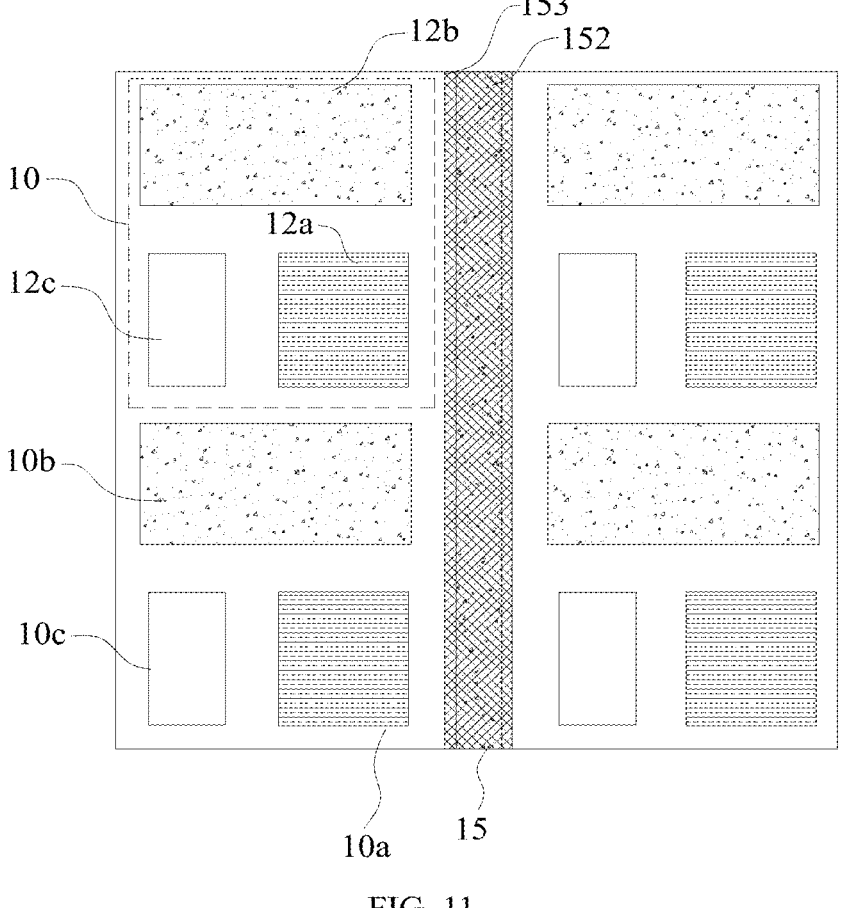
FIG. 11 is a schematic structural diagram of the anti-view sub-pixels extending in a column direction provided in embodiment 2 or embodiment 7 of the present application.

Embodiment 2 is different from embodiment 1 in that, as shown in FIG. 11, the anti-view pixel cell in embodiment 2 is located between the pixel cells 10 in two adjacent columns, the anti-view pixel cell includes one anti-view sub-pixel 15, and the anti-view sub-pixel 15 is extended in the column direction.

The anti-view sub-pixel 15 is different in color from at least one adjacent sub-pixel, for example, the sub-pixel in the pixel cell 10 on the left side of the anti-view sub-pixel 15 is the red sub-pixel 10*a*, and the sub-pixel in the pixel cell 10 on the right side of the anti-view sub-pixel 15 is the blue sub-pixel 10*c*, and the anti-view sub-pixel 15 can be presented either blue or red.

It should be noted that when either of the red sub-pixel 10*a* or the blue sub-pixel 10*c* does not emit light, the anti-view sub-pixel 15 can replace the red sub-pixel 10*a* or the blue sub-pixel 10*c* to emit red or blue light, thereby ensuring a normal display effect while ensuring the anti-view function.

For example, when the anti-view sub-pixel 15 is located at the blue sub-pixel 10*c* and the red sub-pixel 10*a*, and the blue sub-pixel 10*c* is damaged and does not emit light, and the anti-view sub-pixel 15 shows blue, when the anti-view sub-pixel 15 is turned on, the blue light is mixed with the light at the red sub-pixel 10*a* to interfere with the reading of information here, thereby achieving anti-view, while the other side of the anti-view sub-pixel 15 emits blue light instead of the blue sub-pixel 10*c*, thereby achieving normal display.

Embodiment 3

Figure 12:
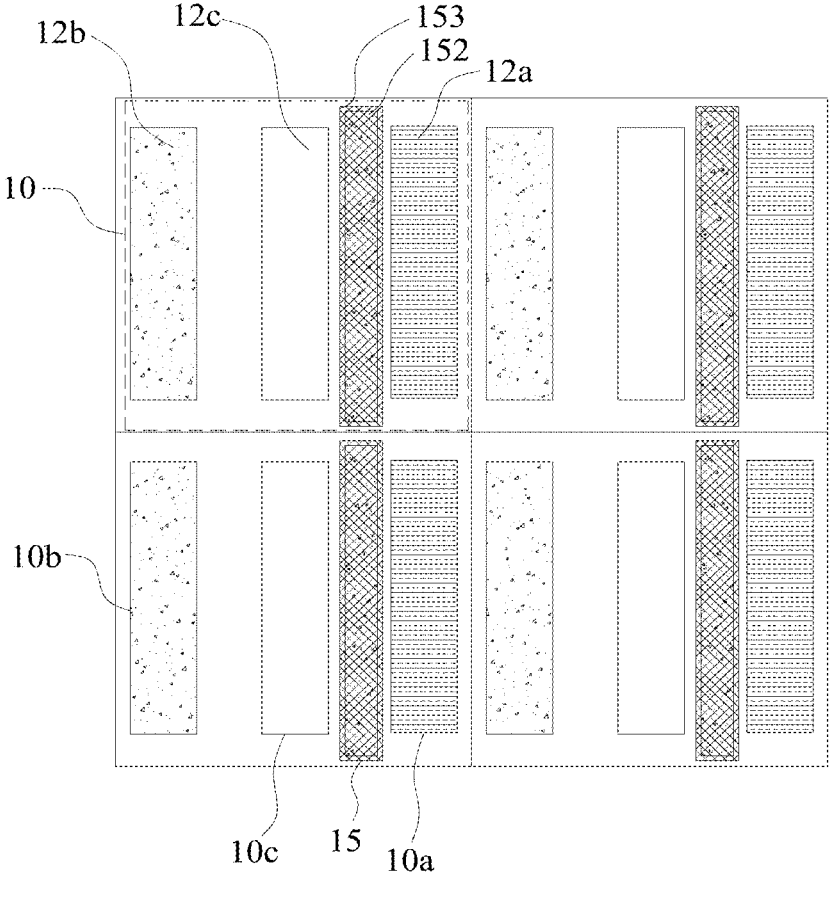
FIG. 12 is a schematic structural diagram of a plurality of sub-pixels arranged in the column direction provided in embodiment 3 or embodiment 7 of the present application.

The third embodiment differs from embodiment 1 in that, as shown in FIG. 12, three sub-pixels in the pixel cell 10 are sequentially arranged at intervals in the same row direction, each pixel cell 10 includes one anti-view pixel cell, and the anti-view sub-pixel 15 is added between the two sub-pixels to achieve the anti-view function. By adding the anti-view sub-pixel 15 to each pixel cell 10, the design cost of the anti-view sub-pixel 15 can be reduced, thereby reducing the production cost.

Embodiment 4

Figure 13:
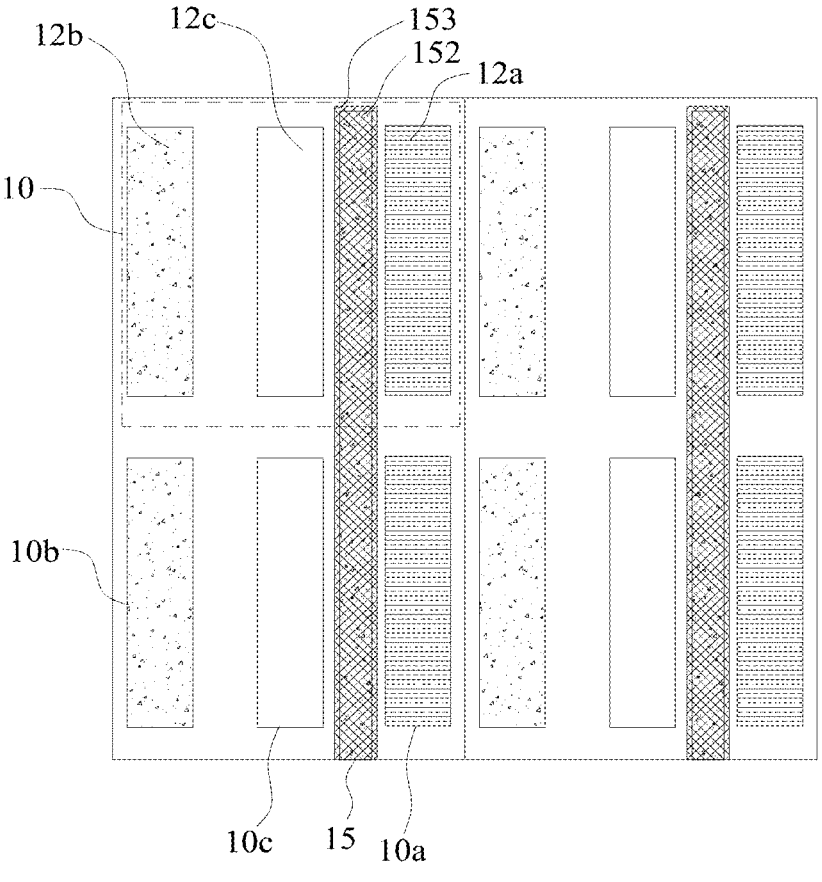
FIG. 13 is a schematic structural diagram of the anti-view sub-pixels extending in the column direction provided in embodiment 4 or embodiment 7 of the present application.

Embodiment 4 differs from embodiment 3 in that, as shown in FIG. 13, the anti-view pixel cell includes one anti-view sub-pixel 15, the anti-view sub-pixel 15 extends in the column direction, and the anti-view sub-pixel 15 penetrates through different pixel cells 10 in the column direction to achieve anti-view. By extending the anti-view sub-pixel 15 in the column direction, the manufacturing process is simplified, and the production cost is reduced. In addition, the anti-view sub-pixel 15 in the same column direction can be turned on or off with one key.

Embodiment 5

Figure 14:
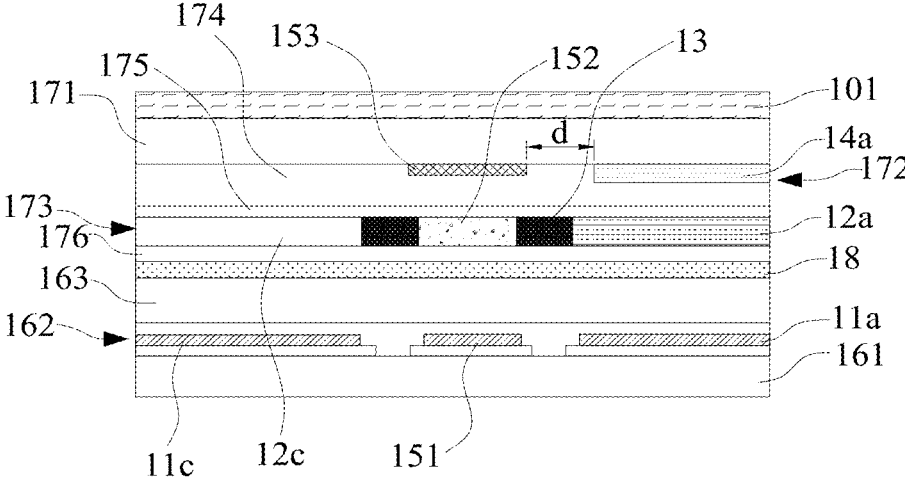
FIG. 14 shows a schematic structural diagram of a polarizing layer arranged on a side of the second base board away from the first base board provided in embodiment 5 or embodiment 7 of the present application.

Embodiment 5 differs from embodiment 1 in that, as shown in FIG. 14, a polarizing layer 101 is provided on the side of the second base board 17 away from the first base board 16 to reduce the reflection intensity of ambient light on the screen.

Embodiments 6

Figure 15:
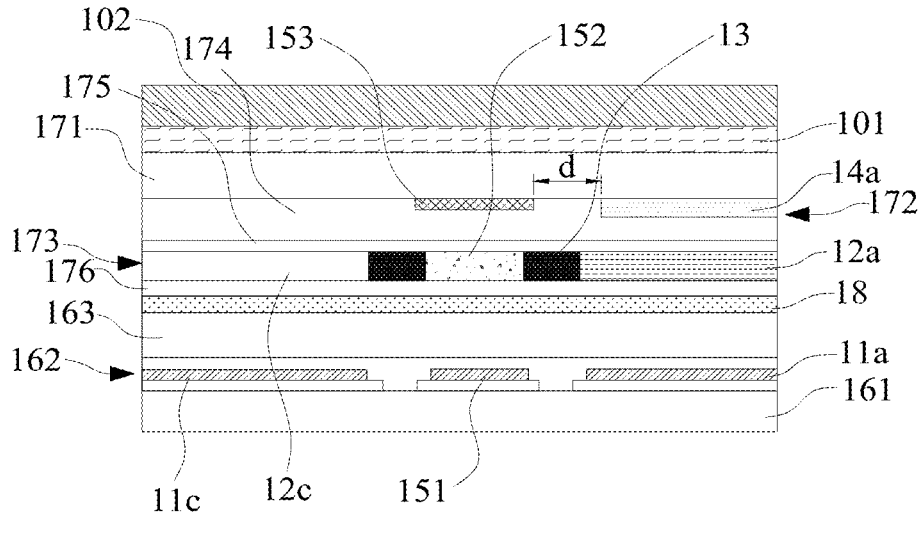
FIG. 15 shows a structural schematic diagram of a polarizing layer and a capping layer provided on the second base board away from the first base board provided in embodiment 6 or embodiment 7 of the present application.

Embodiment 6 differs from embodiment 5 in that, as shown in FIG. 15, a capping layer 102 is provided on the side of the second base board 17 away from the first base board 16, and the capping layer 102 is provided on a side of the polarizing layer 101 away from the second base board 17.

The capping layer 102 (CPL for short) is formed of lithium fluoride (LiF) or the like and is used for modulating the microcavity structure to enhance the light emission of the light emitting layer.

Embodiment 7

Figure 16:
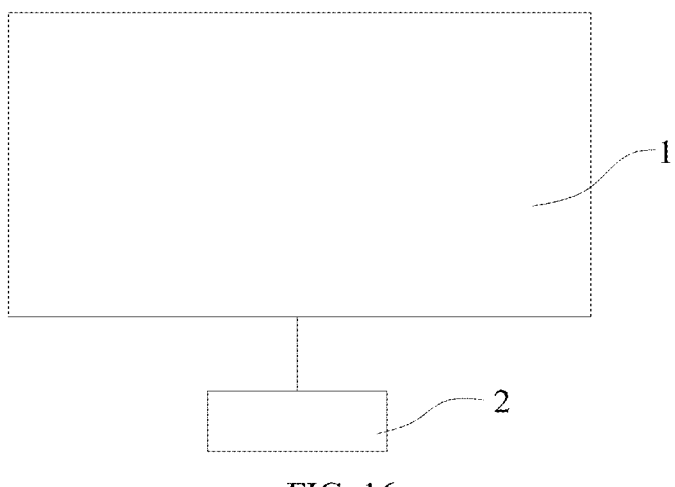
FIG. 16 shows a schematic structural diagram of a display device connected with a main board provided in embodiment 7 of the present application.

The present application also provides a display device, which is shown in FIG. 16. The display device comprises a display panel 1 and a main board 2. The main board 2 is connected to the display panel 1 and is used for driving the display panel 1 to display an image. The display panel 1 includes the display panel 1 disclosed in any one of embodiments 1 to 6 and will not be described here in detail. Reference can be made to embodiments 1 to 6 in detail.

The display device may be any electronic device having a display function such as a mobile phone, a tablet computer, a notebook computer, an e-book or a television.

In the content of the description, illustrations of the reference terms "some embodiments," "example," etc. mean that specific features, structures, materials, or characteristics described in connection with the embodiment or example are encompassed in at least one embodiment or example of the present application. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may combine and incorporate different embodiments or examples described in the description and features of different embodiments or examples.

Although embodiments of the present application have been shown and described above, it will be understood that the above-mentioned embodiments are exemplary and cannot be construed as limiting the present application. Those of ordinary skill in the art may make changes, variations, alternatives and modifications to the above-mentioned embodiments within the scope of the present application. Therefore, any changes or modifications made in accordance with the claims and descriptions of the present application should fall within the scope of the patent of the present application.

What is claimed is:

1. A display panel comprising:
   a plurality of pixel cells arranged in an array, each of the plurality of pixel cells comprising a plurality of display sub-pixels emitting different colors of light, each of the plurality of display sub-pixels comprising:
   a red sub-pixel comprising a first blue light-emitting component, a red quantum dot cell and a red color resistor arranged in sequence;

a green sub-pixel comprising a second blue light-emitting component, a green quantum dot cell and a green color resistor arranged in sequence; and
   a blue sub-pixel comprising a third blue light-emitting component and a transparent cell arranged in sequence; and
   an anti-view sub-pixel located between at least two adjacent display sub-pixels, wherein the anti-view sub-pixel comprises an anti-view blue light-emitting component, an anti-view quantum dot cell and an anti-view layer arranged in sequence;
   wherein the anti-view blue light-emitting component and the anti-view quantum dot cell are located in an orthographic projection of the anti-view layer, and a color of the anti-view quantum dot cell is different from a color of the quantum dot cell adjacent to the anti-view quantum dot cell; and
   wherein the display panel comprises a plurality of anti-view sub-pixels, each of the plurality of pixel cells comprises the plurality of anti-view sub-pixels, and each of the plurality of anti-view sub-pixels is located between the red sub-pixel and the blue sub-pixel in each of the plurality of pixel cells.

2. The display panel according to claim 1, further comprising:
   a first base board comprising a first substrate and the first blue light-emitting component, the second blue light-emitting component, the third blue light-emitting component and the anti-view blue light-emitting component arranged on the first substrate; and
   a second base board comprising a second substrate and the red quantum dot cell, the red color resistor, the green quantum dot cell, the green color resistor, the transparent cell, the anti-view quantum dot cell and the anti-view layer arranged on the second substrate;
   wherein the first base board and the second base board are oppositely arranged.

3. The display panel according to claim 2, wherein the display panel further comprises a bonding layer, and the first base board is bonded to the second base board through the bonding layer.

4. The display panel according to claim 2, wherein the first base board and the second base board are connected by electrostatic adsorption.

5. The display panel according to claim 3, wherein the display panel further comprises an anti-reflection layer, and the anti-reflection layer is disposed on a side of the second base board away from the first base board.

6. The display panel according to claim 1, wherein a gap is provided between the anti-view layer and the red color resistor.

7. The display panel according to claim 1, wherein a light shielding post is arranged between any adjacent two of the red quantum dot cell, the green quantum dot cell, the transparent cell and the anti-view quantum dot cell.

8. The display panel according to claim 2, wherein the anti-view layer and an adjacent color resistor have a distance (d), and the distance satisfies $0 < d \leq 16$ µm.

9. The display panel according to claim 8, wherein when the distance between the anti-view layer and the adjacent color resistor is 16 µm, the adjacent color resistor coincides with the orthographic projection of the light-emitting component on the first substrate, and the anti-view layer completely coincides with the orthographic projection of the anti-view light-emitting component on the first substrate.

10. The display panel according to claim 1, wherein the anti-view layer contacts an adjacent color resistor.

11. The display panel according to claim 2, wherein the second base board further comprises a flat layer, the flat layer is arranged on the second substrate, and the flat layer covers the red color resistor, the green color resistor and the anti-view layer; and wherein the second base board further comprises a first encapsulation layer and a second encapsulation layer, the red quantum dot cell, the green quantum dot cell, the transparent cell and the anti-view quantum dot cell are sandwiched between the first encapsulation layer and the second encapsulation layer; and wherein the display panel further comprises a polarizing layer arranged on a side of the second base board away from the first base board.

12. The display panel according to claim 2, wherein the second base board further comprises a flat layer, the flat layer is arranged on the second substrate, and the flat layer covers the red color resistor, the green color resistor and the anti-view layer.

13. The display panel according to claim 2, wherein the second base board further comprises a first encapsulation layer and a second encapsulation layer, the red quantum dot cell, the green quantum dot cell, the transparent cell and the anti-view quantum dot cell are sandwiched between the first encapsulation layer and the second encapsulation layer.

14. The display panel according to claim 2, wherein the display panel further comprises a polarizing layer arranged on a side of the second base board away from the first base board.

15. A display device comprising a main board and a display panel, wherein the main board is electrically connected to the display panel;

wherein the display panel comprises:

a plurality of pixel cells arranged in an array, each of the plurality of pixel cells comprising a plurality of display sub-pixels emitting different colors of light, each of the plurality of display sub-pixels comprising:

a red sub-pixel comprising a first blue light-emitting component, a red quantum dot cell and a red color resistor arranged in sequence;

a green sub-pixel comprising a second blue light-emitting component, a green quantum dot cell and a green color resistor arranged in sequence; and a blue sub-pixel comprising a third blue light-emitting component and a transparent cell arranged in sequence; and an anti-view sub-pixel located between at least two adjacent display sub-pixels, wherein the anti-view sub-pixel comprises an anti-view blue light-emitting component, an anti-view quantum dot cell and an anti-view layer arranged in sequence;

wherein the anti-view blue light-emitting component and the anti-view quantum dot cell are located in an orthographic projection of the anti-view layer, and a color of the anti-view quantum dot cell is different from a color of the quantum dot cell adjacent to the anti-view quantum dot cell; and wherein the display panel comprises a plurality of anti-view sub-pixels, each of the plurality of pixel cells comprises the plurality of anti-view sub-pixels, and each of the plurality of anti-view sub-pixels is located between the red sub-pixel and the blue sub-pixel in each of the plurality of pixel cells.

16. The display device according to claim 15, further comprising:

a first base board comprising a first substrate and the first blue light-emitting component, the second blue light-emitting component, the third blue light-emitting component and the anti-view blue light-emitting component arranged on the first substrate; and a second base board comprising a second substrate and the red quantum dot cell, the red color resistor, the green quantum dot cell, the green color resistor, the transparent cell, the anti-view quantum dot cell and the anti-view layer arranged on the second substrate;

wherein the first base board and the second base board are oppositely arranged.

17. The display device according to claim 16, wherein the display panel further comprises a bonding layer, and the first base board is bonded to the second base board through the bonding layer.

18. The display device according to claim 16, wherein the anti-view layer and an adjacent color resistor have a distance (d), and the distance satisfies $0<d\leq16$ μm.

19. The display device according to claim 18, wherein when the distance between the anti-view layer and the adjacent color resistor is 16 μm, the adjacent color resistor coincides with the orthographic projection of the light-emitting component on the first substrate, and the anti-view layer completely coincides with the orthographic projection of the anti-view light-emitting component on the first substrate.

\* \* \* \* \*